United States Patent
Jia et al.

(10) Patent No.: US 10,141,408 B2
(45) Date of Patent: Nov. 27, 2018

(54) METHOD AND ARRANGEMENT FOR REDUCING CONTACT RESISTANCE OF TWO-DIMENSIONAL CRYSTAL MATERIAL

(71) Applicant: INSTITUTE OF MICROELECTRONICS, CHINESE ACADEMY OF SCIENCES, Beijing (CN)

(72) Inventors: Kunpeng Jia, Beijing (CN); Yajuan Su, Beijing (CN); Huilong Zhu, Poughkeepsie, NY (US); Chao Zhao, Kessel-lo (BE)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 259 days.

(21) Appl. No.: 14/651,980

(22) PCT Filed: Mar. 18, 2014

(86) PCT No.: PCT/CN2014/073586
§ 371 (c)(1),
(2) Date: Jun. 12, 2015

(87) PCT Pub. No.: WO2014/206117
PCT Pub. Date: Dec. 31, 2014

(65) Prior Publication Data
US 2015/0318356 A1 Nov. 5, 2015

(30) Foreign Application Priority Data

Jun. 25, 2013 (CN) .......................... 2013 1 0254601

(51) Int. Cl.
*H01L 21/04* (2006.01)
*H01L 29/16* (2006.01)
(Continued)

(52) U.S. Cl.
CPC ........ *H01L 29/1606* (2013.01); *H01L 21/043* (2013.01); *H01L 21/0415* (2013.01);
(Continued)

(58) Field of Classification Search
CPC ..... H01L 21/823412; H01L 21/823418; H01L 29/66015; H01L 29/66045; H01L 29/1025;
(Continued)

(56) References Cited

U.S. PATENT DOCUMENTS 5,994,208 A * 11/1999 Prins ........................ C30B 31/22
438/527
2005/0074962 A1* 4/2005 Lojek ................ H01L 21/28123
438/622
(Continued)

FOREIGN PATENT DOCUMENTS

JP S60-014476 1/1985
JP H02-303158 A 12/1990

OTHER PUBLICATIONS

International Search Report and Written Opinion as issued in International Patent Application No. PCT/CN2014/073586, dated Jun. 18, 2014.

Primary Examiner — Davienne Monbleau
Assistant Examiner — Leslie Pilar Cruz
(74) Attorney, Agent, or Firm — Pillsbury Winthrop Shaw Pittman LLP

(57) ABSTRACT

A method and an arrangement for reducing a contact resistance of a two-dimensional crystal material are provided. An example method may include forming a contact material layer on a two-dimensional crystal material layer; performing ion implantation; and performing thermal annealing.

13 Claims, 3 Drawing Sheets

(51) Int. Cl.
*H01L 29/24* (2006.01)
*H01L 29/167* (2006.01)
*H01L 21/265* (2006.01)
*H01L 21/266* (2006.01)
*H01L 21/283* (2006.01)
*H01L 29/45* (2006.01)
*H01L 21/426* (2006.01)
*H01L 21/441* (2006.01)
*H01L 21/477* (2006.01)
*H01L 21/324* (2006.01)
*H01L 21/285* (2006.01)

(52) U.S. Cl.
CPC ...... *H01L 21/266* (2013.01); *H01L 21/26513* (2013.01); *H01L 21/283* (2013.01); *H01L 21/28512* (2013.01); *H01L 21/28568* (2013.01); *H01L 21/324* (2013.01); *H01L 21/426* (2013.01); *H01L 21/441* (2013.01); *H01L 21/477* (2013.01); *H01L 29/16* (2013.01); *H01L 29/167* (2013.01); *H01L 29/24* (2013.01); *H01L 29/45* (2013.01)

(58) Field of Classification Search
CPC ............. H01L 29/1029; H01L 29/1033; H01L 21/02694; H01L 21/0415; H01L 21/046; H01L 21/0462; H01L 21/047; H01L 21/2253; H01L 21/266
See application file for complete search history.

(56) References Cited

U.S. PATENT DOCUMENTS

| | | | |
|---|---|---|---|
| 2005/0090045 A1* | 4/2005 | Chang | H01L 27/1214 438/151 |
| 2011/0143045 A1* | 6/2011 | Veerasamy | B82Y 30/00 427/495 |
| 2013/0134391 A1* | 5/2013 | Afzali-Ardakani | H01L 51/105 257/29 |
| 2014/0239257 A1* | 8/2014 | Moon | H01L 29/78684 257/29 |

* cited by examiner

METHOD AND ARRANGEMENT FOR REDUCING CONTACT RESISTANCE OF TWO-DIMENSIONAL CRYSTAL MATERIAL

CROSS-REFERENCE TO RELATED APPLICATION(S)

This application is a U.S. national phase application of PCT Patent Application No. PCT/CN2014/073586, filed on Mar. 18, 2014, which claims priority to Chinese Patent Application No. 201310254601.0, entitled "METHOD FOR REDUCING CONTACT RESISTANCE OF TWO-DIMENSIONAL CRYSTAL MATERIAL," filed on Jun. 25, 2013, which is incorporated herein by reference in its entirety.

TECHNICAL FIELD

The present disclosure relates to the semiconductor manufacture field, and particularly, to a method and an arrangement for reducing a contact resistance of a two-dimensional crystal material.

BACKGROUND

As integrated circuits (ICs) and micro-fabrication technologies develop rapidly, new materials, processes, and devices are emerging in recent years. Among them, new materials are more attractive. For example, two-dimensional crystal materials, such as graphene, transitional metal disulfides, and germylene, are always being focused on since the advent thereof, due to their excellent properties.

However, those two-dimensional crystal materials encounter various problems, such as contact resistance between them and other materials. It is desirable to reduce the contact resistance to access their excellent electrical properties. For example, the graphene can be used as a channel material for transistors, due to its ultra-high carrier, mobility at room temperature. However, the contact resistance between graphene and other materials hinders further progress in device performance. Long-channel devices may have relatively high tolerance to contact resistance, but the performance of short-channel devices will be suppressed greatly if the contact resistance is comparable to the channel resistance. The contact resistance between the graphene and other materials has become a bottleneck, which prevents graphene-based devices from scaling down and enhancing performance.

SUMMARY

The present disclosure aims to provide, among others, a method and an arrangement which facilitate reduction of contact resistance between a two-dimensional crystal material and another material, so as to solve at least some of the above problems.

According to an embodiment, there is provided a method. The method may comprise forming a contact material layer on a two-dimensional crystal material layer, performing ion implantation, and performing thermal annealing.

According to a further embodiment, there is provided an arrangement. The arrangement may comprise a two-dimensional crystal material layer and a contact material layer disposed on the two-dimensional crystal material layer. At an interface between the two-dimensional crystal material layer and the contact material layer, vacancies in the two-dimensional crystal material layer, the material of the contact material layer, and implanted ions may interact with each other (to, for example, form bonds) to form a low-resistance state.

According to embodiments of the present disclosure, the ion implantation may be performed via the contact material, and then the thermal annealing may be carried out. As a result, it is possible to effectively reduce a contact resistance between the two-dimensional material and the contact material.

BRIEF DESCRIPTION OF THE DRAWINGS

The above and/or further aspects and advantages of the present disclosure will become more apparent from the following descriptions of embodiments with reference to the attached drawings, in which.

DETAILED DESCRIPTION

Figure 1:
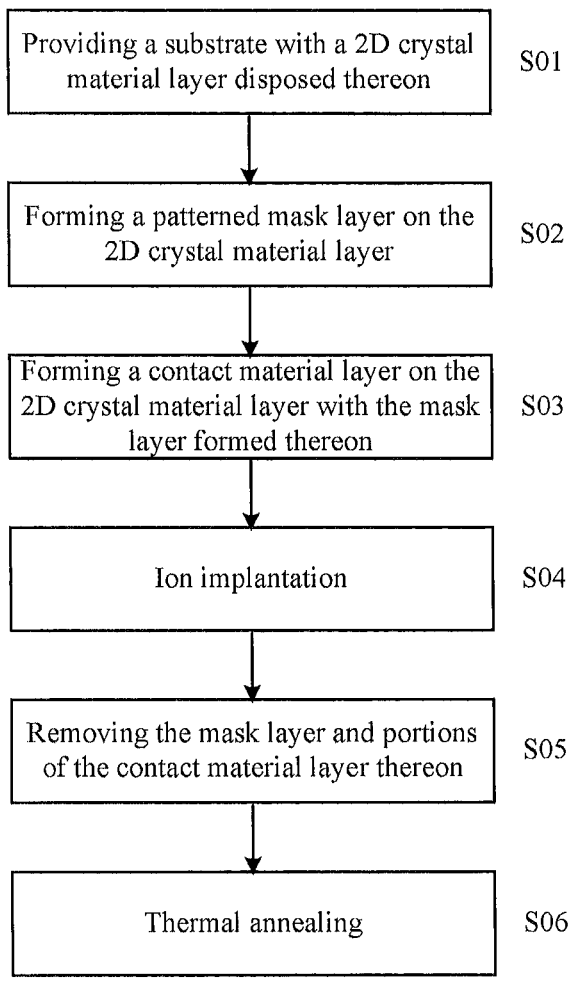
FIG. 1 is a flow chart schematically showing a method of reducing a contact resistance between a two-dimensional crystal material and a contact material according to an embodiment of the present disclosure.

Hereinafter, embodiments of the present disclosure will be described in detail, examples of which are illustrated in the drawings. Throughout the drawings like or similar symbols denote like or similar elements or elements to achieve like or similar functions. Please note that the embodiments are provided just for illustration, and should not be construed as limiting the present disclosure.

According to an embodiment of the present disclosure, ion implantation may be carried out to reduce a contact resistance between a two-dimensional crystal material layer and a contact material layer. Ions will bombard the two-dimensional crystal material layer, resulting in vacancies therein. Then, thermal annealing may be carried out. For example, the thermal annealing may be carried out at a temperature of about 350° C.-500° C. for a period of about 1-30 minutes. The thermal annealing can effectively make the vacancies caused by the implantation interact with the material of the contact material layer and also the implanted ions to form a low-resistance state. For example, the vacancies, the material of the contact material layer and the implanted ions may interact with each other to form bonds. The formed bonds can modify a contact interface so as to reduce the contact resistance.

The ion implantation may be carried out via the contact material layer. By doing so, it is possible to adjust bombardment effects of the implanted ions on the two-dimensional crystal material by means of controlling at least one of the material and thickness of the contact material layer, and at least one of the type, energy and dose of the implanted ions. Further, it is possible to adjust density of the implanted ions resident at the interface, so as to effectively control the contact resistance between the contact material layer and the two-dimensional crystal material layer.

Alternatively, it is also feasible to carry out the ion implantation before formation of the contact material layer. By doing so, it is possible to adjust bombardment effects of the implanted ions on the two-dimensional crystal material by means of controlling at least one of type, energy and dose of the implanted ions. Further, it is possible to adjust density of the implanted ions resident at the interface, so as to effectively control the contact resistance between the contact material layer and the two-dimensional crystal material layer.

The two-dimensional crystal material layer may be disposed on a substrate. For example, the two-dimensional crystal material layer may be disposed on a semiconductor substrate, for manufacture of a semiconductor device. However, the present disclosure is not limited thereto. The substrate may comprise various types of conductive or insulating substrates. Different substrates may be selected based on devices to be manufactured.

According to an embodiment of the present disclosure, the contact material layer may be patterned into, for example, a contact pattern. Such patterning can be achieved by lithography, for example. If the contact material layer is patterned, then the ion implantation may be limited to regions where the patterned contact material layer is present, to avoid impacts on portions of the two-dimensional crystal material layer in other regions. Such localized ion implantation may be achieved by means of a mask layer (by, for example, masking the regions where the ion implantation is not needed).

To simplify the process, especially, to avoid extra masks and etching processes, the patterning of the contact material layer and the localized ion implantation may be integrated. For example, a patterned mask layer may be formed on the two-dimensional crystal material layer. The mask layer may have a pattern corresponding to the contact pattern. For example, the mask layer may mask regions on the two-dimensional crystal material layer where the contact material layer is not to be formed, and may have openings that expose regions on the two-dimensional crystal material layer where the contact material layer is to be formed. A preliminary contact material layer may be formed on the two-dimensional crystal material layer with the mask layer formed thereon. Portions of the preliminary contact material layer on top of the mask layer may be removed later, while portions of the preliminary contact material layer in the openings of the mask layer cover the two-dimensional crystal material layer, thereby constituting the contact material layer. In this case, the ion implantation may be carried out via the preliminary contact material layer with the mask layer thereunder. Due to the mask layer, the ion implantation may have substantially no impact on regions covered by the mask layer. Then, the mask layer together with the portions of the preliminary contact material layer thereon may be removed. The remaining portions of the preliminary contact material layer (i.e., the portions in the openings of the mask layer) may constitute the contact material layer which has been patterned.

The mask layer may comprise photoresist. In this case, the mask layer together with the portions of the preliminary contact material layer thereon may be removed by stripping off. Alternatively, the mask layer may comprise a hard mask. In this case, the mask layer together with the portions of the preliminary contact material layer thereon may be removed by wet etching.

Further thermal annealing may be carried out after forming the patterned mask layer on the two-dimensional crystal material layer and before forming the preliminary contact material layer on the mask layer and the two-dimensional crystal material layer. Such annealing can clean a surface of the two-dimensional crystal material layer.

The technology disclosed herein may be presented in various forms. A particular example will be described in detail with reference to FIGS. 1 and 2 in the following.

Figure 2:
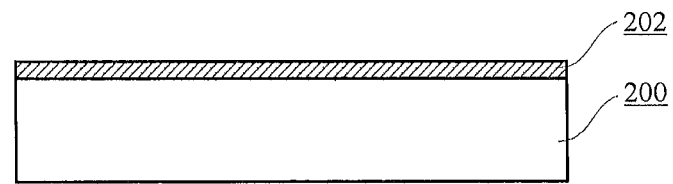
FIGS. 2-7 are sectional views schematically showing several stages during formation of an arrangement according to an embodiment of the present disclosure.

At S01, a substrate 200 may be provided, with a two-dimensional crystal material layer 202 disposed thereon, as shown in FIG. 2.

The substrate 200 may comprise any suitable substrate onto which the two-dimensional crystal material such as graphene is to be transferred and serves as a metal contact, or other substrates, for example, single crystal silicon, poly silicon, amorphous silicon, germanium, or alloy semiconductor or compound semiconductor such as SiGe, SiC, InSb, PbTe, InAs, InP, GaAs, and/or GaSb. The substrate 200 may comprise a stacked semiconductor configuration, such as Si/SiGe, Silicon on Insulator (SOI) or SiGe on Insulator (SGOI).

The two-dimensional crystal material layer may comprise a two-dimensional crystal material, i.e., a material of a single atom or molecule layer, such as graphene, transitional metal disulfides, or germylene.

In this example, the two-dimensional crystal material layer may comprise graphene. One or more layers of graphene may be formed by chemical vapor deposition (CVD), thermal decomposition, micromechanical cleavage, bonding and transfer, or other suitable method.

Figure 3:
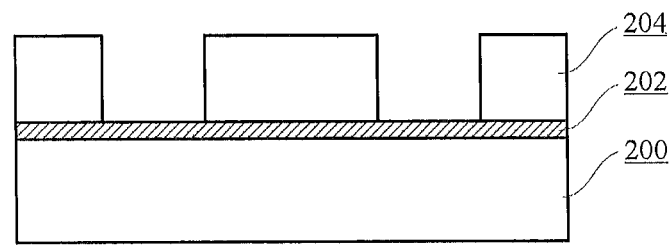

At S02, a patterned mask layer 204 may be formed on the two-dimensional crystal material layer 202, as shown in FIG. 3.

In this example, the mask layer 204 may comprise a hard mask, such as silicon nitride, aluminum oxide, or silicon oxide. The mask layer 204 may be formed by depositing and then patterning a mask material layer. For example, a layer of photoresist may be formed on the deposited mask material layer and then patterned by exposure and developing. After that, the mask material layer may be etched by using the patterned photoresist as a mask, to form the mask layer 204. After the hard mask is formed, thermal annealing may be further carried out, to clean a surface of the two-dimensional crystal material layer 202.

Alternatively, the mask layer 204 may comprise photoresist. For example, the patterned mask layer of photoresist may be formed by coating, pre-bake, exposure, and developing.

Figure 4:
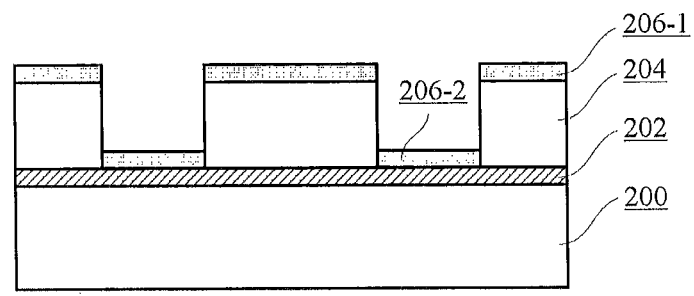

At S03, a contact material layer may be formed on the two-dimensional crystal material layer 202 with the mask layer 204 formed thereon. The contact material layer may comprise portions 206-1 on top of the mask layer 204 and portions 206-2 located in openings in the mask layer 204, as shown in FIG. 4.

The portions 206-2 of the contact material layer may be in contact with the two-dimensional crystal material layer 202, to, for example, control voltage thereon, draw current therefrom, or the like. Generally, the contact material layer (206-1, 206-2) may comprise conductor(s). In this example, the contact material layer may comprise metal, such as Ti, Pd, Ni, Cr, Pt, W, Cu, or the like. The contact material layer may be formed by evaporation, sputtering, or other suitable method, to a thickness determined substantially by subsequent device process requirements.

Figure 5:
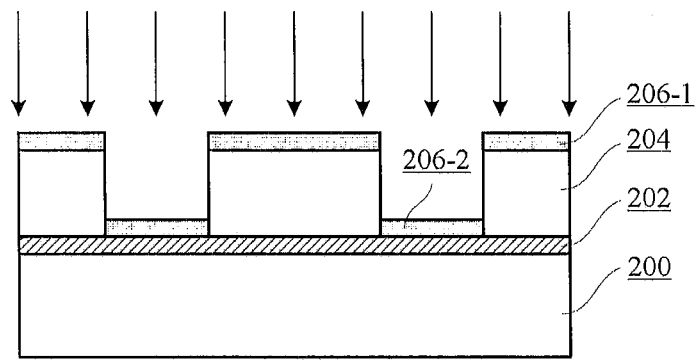

At S04, ion implantation may be carried out, as shown in FIG. 5. Types of ions and implantation methods adopted in the ion implantation may be selected based on demands.

In this example, the implanted ions may comprise phosphor ions at a dose of about 4e15. The implantation may be carried out at an energy determined by, for example, the material and thickness of the contact material layer. However, the implanted ions and the dose can be set as desired, instead of being limited thereto.

Figure 6:
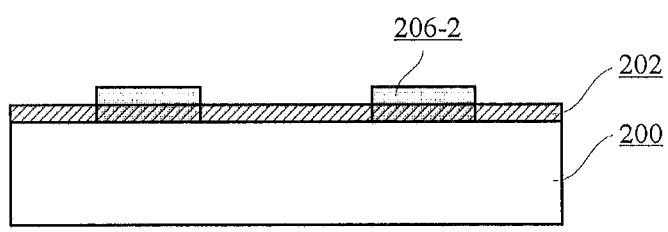

At S05, the mask layer 204 together with the portions 206-1 of the contact material layer thereon may be removed, as shown in FIG. 6.

In this example, in the case where the mask layer comprises the hard mask such as silicon oxide, the hard mask may be removed by wet etching with hydrofluoric acid (HF) solution, for example. Thus, the portions of the contact material layer thereon are also removed.

Alternatively, in the case where the mask layer comprise photoresist, the mask layer 204 together with the portions 206-1 of the contact material layer thereon may be removed by stripping off. Specifically, the mask layer 204 of photoresist may be dissolved in a stripping solvent such as acetone, and thus the portions 206-1 of the contact material layer thereon are also stripped off. As a result, the mask layer 204 and the portions 206-1 of the contact material layer thereon may be removed in a single step.

At S06, thermal annealing may be carried out. The thermal annealing may be carried out after the ion implantation and stripping off of the mask layer and the portions of the contact material layer thereon. In this example, the thermal annealing may be carried out at a temperature of about 350° C.-500° C. for a period of about 1-30 minutes. The thermal annealing may effectively make vacancies caused by the implantation interact with the contact material and the implanted ion (to, for example, form bonds) to reduce the contact resistance.

Thus, an arrangement is achieved. As shown in FIG. 6, the arrangement may comprise the two-dimensional crystal material layer 202 and the contact material layer 206-2 disposed thereon. The contact material layer 206-2 may be patterned, to form, for example, contacts to the two-dimensional crystal material layer 202. At an interface between the two-dimensional crystal material layer 202 and the contact material layer 206-2, the vacancies in the two-dimensional crystal material layer, the material of the contact material layer, and the implanted ions may interact with each other to form a low-resistance state. For example, the vacancies, the material of the contact material layer, and the implanted ions may form bonds, which bonds can reduce the contact resistance between the two-dimensional crystal material layer 202 and the contact material layer 206-2.

Figure 7:
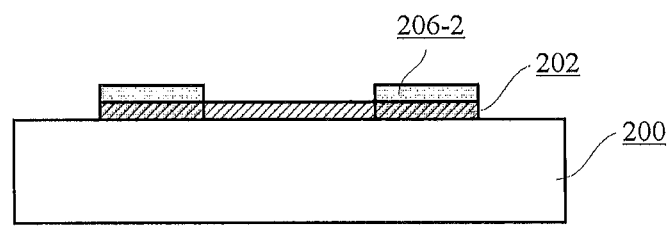

After the contacts are formed as described above, subsequent processes may be performed as desired. For example, the two-dimensional crystal material layer 202 may be further patterned, as shown in FIG. 7.

In the above example, after the contact material layer is formed, the ion implantation is carried out via the contact material layer. However, the present disclosure is not limited thereto. For example, the ion implantation may be carried out before formation of the contact material layer. Specifically, the ion implantation may be carried out after the mask layer 204 is formed as shown in FIG. 3, and then the contact material layer may be formed as shown in FIGS. 4-7 (omitting the ion implantation as shown in FIG. 5).

The above example is provided to illustrate the technology, but is not intended to limit the present disclosure.

From the foregoing, it will be appreciated that specific embodiments of the disclosure have been described herein for purposes of illustration, but that various modifications may be made without deviating from the disclosure. In addition, many of the elements of one embodiment may be combined with other embodiments in addition to or in lieu of the elements of the other embodiments. Accordingly, the technology is not limited except as by the appended claims.

We claim:

1. A method, comprising:
    forming a contact material layer on a two-dimensional crystal material layer, the contact material layer forming an electrical contact to the two-dimensional crystal material layer;
    performing ion implantation on at least the two-dimensional crystal material layer, to bombard the two-dimensional crystal material layer so as to create vacancies therein; and
    performing thermal annealing of the contact material layer and the two-dimensional crystal material layer for interaction of the vacancies with the contact material layer and implanted ions, so that they form bonds to modify a contact interface between the contact material layer and the two-dimensional crystal material layer.

2. The method according to claim 1, wherein the ion implantation is performed via the contact material layer.

3. The method according to claim 1, wherein the ion implantation is performed prior to forming the contact material layer.

4. The method according to claim 1, wherein the two-dimensional crystal material layer is disposed on a substrate.

5. The method according to claim 1, further comprising patterning the contact material layer.

6. The method according to claim 5, wherein the patterning comprises:
    forming a patterned mask layer on the two-dimensional crystal material layer;
    forming a preliminary contact material layer on the two-dimensional crystal material layer with the mask layer formed thereon, wherein the ion implantation is performed via the preliminary contact material layer with the mask layer thereunder; and
    removing the mask layer and portions of the preliminary contact material layer thereon, leaving remaining portions of the preliminary contact material layer to constitute the contact material layer which has been patterned.

7. The method according to claim 6, wherein the mask layer comprises photoresist, and the removing is carried out by stripping off.

8. The method according to claim 6, wherein the mask layer comprises a hard mask, and the removing is carried out by wet etching.

9. The method according to claim 8, further comprising performing thermal annealing after forming the patterned mask layer on the two-dimensional crystal material layer and before forming the preliminary contact material layer on the mask layer and the two-dimensional crystal material layer.

10. The method according to claim 1, wherein the two-dimensional crystal material layer comprises one or more selected from: graphene, a transitional metal disulfide, or germylene.

11. The method according to claim 1, wherein the thermal annealing is performed at a temperature of about 350° C.-500° C. for a period of about 1-30 minutes.

12. The method of claim 1, further comprising forming a semiconductor device using the contact material layer on the two-dimensional crystal material layer.

13. A device comprising a contact material layer on a two-dimensional crystal material layer manufactured according to the method of claim 1.

* * * * *